United States Patent [19]

Haley et al.

[11] Patent Number: 5,466,557
[45] Date of Patent: Nov. 14, 1995

[54] RADIATION-SENSITIVE COMPOSITION CONTAINING A RESOLE RESIN, A NOVOLAC RESIN, A LATENT BRONSTED ACID, AN INFRARED ABSORBER AND TEREPHTHALALDEHYDE AND USE THEREOF IN LITHOGRAPHIC PRINTING PLATES

[75] Inventors: Neil F. Haley, Wellington; Steven L. Corbiere, Windsor, both of Colo.

[73] Assignee: Eastman Kodak Company, Rochester, N.Y.

[21] Appl. No.: 298,472

[22] Filed: Aug. 29, 1994

[51] Int. Cl.$^6$ ............................................. G03C 1/76
[52] U.S. Cl. ........................ 430/278; 430/270; 430/302; 430/157; 430/271; 430/920; 430/926
[58] Field of Search ........................... 430/270, 302, 430/157, 271, 278, 920, 926

[56] References Cited

U.S. PATENT DOCUMENTS

| | | | |
|---|---|---|---|
| 4,189,323 | 2/1980 | Buhr | 430/281 |
| 4,247,611 | 1/1981 | Sander et al. | 430/270 |
| 4,693,958 | 9/1987 | Schwartz et al. | 430/270 |
| 4,708,925 | 11/1987 | Newman | 430/270 |
| 4,927,741 | 5/1990 | Garth et al. | 430/325 |
| 4,946,759 | 8/1990 | Doessel et al. | 430/270 |
| 5,085,972 | 2/1992 | Vogel | 430/270 |
| 5,114,577 | 5/1992 | Kurano et al. | 210/198.2 |
| 5,149,613 | 9/1992 | Stahlhofen et al. | 430/270 |
| 5,238,781 | 8/1993 | Schadeli | 430/270 |

FOREIGN PATENT DOCUMENTS 2082339  3/1982  United Kingdom.

*Primary Examiner*—Marion E. McCamish
*Assistant Examiner*—Laura Weiner
*Attorney, Agent, or Firm*—Alfred P. Lorenzo

[57] ABSTRACT

A radiation-sensitive composition especially adapted to prepare a lithographic printing plate that is sensitive to both ultraviolet and infrared radiation and capable of functioning in either a positive-working or negative-working manner is comprised of (1) a resole resin, (2) a novolac resin, (3) a latent Bronsted acid, (4) an infrared absorber, and (5) terephthalaldehyde. The solubility of the composition in aqueous alkaline developing solution is both reduced in exposed areas and increased in unexposed areas by the steps of imagewise exposure to activating radiation and heating.

27 Claims, No Drawings

RADIATION-SENSITIVE COMPOSITION CONTAINING A RESOLE RESIN, A NOVOLAC RESIN, A LATENT BRONSTED ACID, AN INFRARED ABSORBER AND TEREPHTHALALDEHYDE AND USE THEREOF IN LITHOGRAPHIC PRINTING PLATES

CROSS-REFERENCE TO RELATED APPLICATIONS

Commonly assigned U.S. Pat. application Ser. No. 205,125, "Radiation-Sensitive Composition Containing A Resole Resin And A Novolac Resin And Use Thereof In Lithographic Printing Plates" by Neil F. Haley and Steven L. Corbiere, filed Mar. 1, 1994, as a continuation of U.S. patent application Ser. No. 065,103, filed May 19, 1993 and issued Dec. 13, 1994, as U.S. Pat. No. 5,372,907, describes a radiation-sensitive composition comprised of (1) a resole resin, (2) a novolac resin, (3) a latent Bronsted acid and (4) an infrared absorber and use thereof in the preparation of a lithographic printing plate that is capable of use as either a positive-working plate or a negative-working plate.

Copending commonly assigned U.S. Pat. application Ser. No. 212,434, filed Mar. 14, 1994, "Radiation-Sensitive Composition Containing A Resole Resin, A Novolac Resin, An Infrared Absorber And A Triazine And Use Thereof In Lithographic Printing Plates" by Neil F. Haley and Steven L. Corbiere describes similar radiation-sensitive compositions to those of application Ser. No. 205,125 in which a haloalkyl-substituted s-triazine is utilized as a latent Bronsted acid.

FIELD OF THE INVENTION

This invention relates in general to novel radiation-sensitive compositions and in particular to the use of such compositions in lithographic printing plates. More specifically, this invention relates to radiation-sensitive compositions comprising both a resole resin and a novolac resin and to lithographic printing plates comprising an imaging layer formed from such radiation-sensitive compositions.

BACKGROUND OF THE INVENTION

The art of lithographic printing is based upon the immiscibility of oil and water, wherein the oily material or ink is preferentially retained by the image area and the water or fountain solution is preferentially retained by the non-image area. When a suitably prepared surface is moistened with water and an ink is then applied, the background or non-image area retains the water and repels the ink while the image area accepts the ink and repels the water. The ink on the image area is then transferred to the surface of a material upon which the image is to be reproduced; such as paper, cloth and the like. Commonly the ink is transferred to an intermediate material called the blanket which in turn transfers the ink to the surface of the material upon which the image is to be reproduced.

A very widely used type of lithographic printing plate has a light-sensitive coating applied to an aluminum base support. The coating may respond to light by having the portion which is exposed become soluble so that it is removed in the developing process. Such a plate is referred to as positive-working. Conversely, when that portion of the coating which is exposed becomes hardened, the plate is referred to as negative-working. In both instances the image area remaining is ink-receptive or oleophilic and the non-image area or background is water-receptive or hydrophilic. The differentiation between image and non-image areas is made in the exposure process where a film is applied to the plate with a vacuum to insure good contact. The plate is then exposed to a light source, a portion of which is composed of UV radiation. In the instance where a positive plate is used, the area on the film that corresponds to the image on the plate is opaque so that no light will strike the plate, whereas the area on the film that corresponds to the non-image area is clear and permits the transmission of light to the coating which then becomes more soluble and is removed. In the case of a negative plate the converse is true. The area on the film corresponding to the image area is clear while the non-image area is opaque. The coating under the clear area of film is hardened by the action of light while the area not struck by light is removed. The light-hardened surface of a negative plate is therefore oleophilic and will accept ink while the non-image area which has had the coating removed through the action of a developer is desensitized and is therefore hydrophilic.

The manufacture of a printing plate which can be employed as either a positive-working plate or a negative-working plate has been proposed heretofore. Such a plate has the advantage of increased versatility since either positive or negative originals can be used.

One example of a printing plate which can be employed as either a positive-working plate or a negative-working plate is that described in British Patent No. 2,082,339, published Mar. 3, 1982 and in U.S. Pat. No. 4,927,741, issued May 22, 1990. These patents describe a lithographic printing plate in which the imaging layer comprises a resole resin and an orthoquinone diazide and, optionally, also contains a novolac resin. Such a plate can be used as a positive-working plate by a process comprising the steps of imagewise exposure and development with an aqueous alkaline developing solution to remove the coating from the exposed areas. Alternatively, it can be used as a negative-working plate by a process comprising the steps of imagewise exposure, heating of the plate to convert the coating in the exposed areas to an insoluble form, overall exposure of the plate to radiation to render previously unexposed areas soluble, and development with an aqueous alkaline developing solution to remove such soluble areas.

A further example of a printing plate which can be employed as either a positive-working plate or a negative-working plate is that described in U.S. Pat. No. 4,708,925, issued Nov. 24, 1987. This patent describes a lithographic printing plate in which the imaging layer comprises a phenolic resin and a radiation-sensitive onium salt. As described in the patent, the interaction of the phenolic resin and the onium salt produces an alkali-insoluble composition which is restored to alkali-solubility upon photolytic decomposition of the onium salt. The printing plate can be utilized as a positive-working plate or as a negative-working plate using the same process steps as are described hereinabove in regard to the plates of British Patent 2,082,339 and U.S. Pat. No. 4,927,741.

The radiation-sensitive composition described in U.S. Pat. No. 4,708,925 is useful for the preparation of a direct laser addressable plate. Digital imaging information can be used to image the plate without the need to utilize an imaging master such as a photographic transparency.

The hereinabove described printing plates of the prior art which can be employed as either a positive-working plate or a negative-working plate are lacking in one or more desirable features. Thus, the plates described in British Patent No.

2,082,339 are not infrared-sensitive and thus cannot be digitally imaged by a laser which emits in the infrared region. Moreover, both the plates of British Patent No. 2,082,339 and U.S. Pat. No. 4,708,925 require two exposure steps in order to be utilized as a negative-working plate, i.e., an imagewise exposure and a subsequent overall exposure. This adds greatly to the cost and complexity of the process. The difficulties of carrying out a process requiring multiple exposure steps, while meeting the requirements of the trade for high speed processing, are described in U.S. Pat. No. 4,927,741.

Radiation-sensitive compositions comprised of (1) a resole resin, (2) a novolac resin, (3) a latent Bronsted acid and (4) an infrared absorber are described in commonly assigned U.S. patent application Ser. No. 205,125, filed Mar. 1, 1994, "Radiation-Sensitive Composition Containing A Resole Resin And A Novolac Resin And Use Thereof In Lithographic Printing Plates" by Neil F. Haley and Steven L. Corbiere and issued Dec. 13, 1994, as U.S. Pat. No. 5,372,907.

Radiation-sensitive compositions comprised of (1) a resole resin, (2) a novolac resin, (3) a latent Bronsted acid and (4) an infrared absorber and which are characterized in that the latent Bronsted acid is a haloalkyl-substituted s-triazine are described in copending commonly assigned U.S. patent application Ser. No. 212,434, filed Mar. 14, 1994, "Radiation-Sensitive Composition Containing A Resole Resin, A Novolac Resin, An Infrared Absorber And A Triazine And Use Thereof In Lithographic Printing Plates" by Neil F. Haley and Steven L. Corbiere.

The compositions of copending patent applications Ser. Nos. 205,125 and 212,434 are useful in preparing a lithographic printing plate which can be employed as either a positive-working plate or a negative-working plate. To utilize these lithographic printing plates as a positive-working plate requires that they be imagewise exposed to activating radiation, thereby rendering the exposed areas alkali-soluble, and contacted with an aqueous alkaline developing solution to remove the exposed areas. To utilize them as a negative-working plate requires the steps of imagewise exposure to activating radiation, heating of the plate to provide reduced solubility in exposed areas and increased solubility in unexposed areas, and contact with an aqueous alkaline processing solution to remove the unexposed areas. In contrast with the printing plates of British Patent No. 2,082,339 and U.S. Pat. No. 4,708,925, use of both a resole resin and a novolac resin is essential and the use of two exposure steps is not necessary.

While the radiation-sensitive compositions of U.S. patent application Ser. No. 205,125 and U.S. patent application Ser. No. 212,434 represent a major advance in the art, they would benefit from a further improvement in their properties, especially in regard to enhanced speed. It is toward the objective of providing such further improvement that the present invention is directed.

SUMMARY OF THE INVENTION

In accordance with this invention, a novel radiation-sensitive composition is comprised of (1) a resole resin, (2) a novolac resin, (3) a latent Bronsted acid, (4) an infrared absorber, and (5) terephthalaldehyde. This composition has many different uses, for example, it is useful as a photoresist, but it is especially useful in the preparation of a lithographic printing plate comprised of a support and an imaging layer formed from the radiation-sensitive composition. The resulting printing plate has many advantageous characteristics. In particular, the plate is:

(1) infrared sensitive to faciliate digital imaging by exposure to infrared radiation;

(2) ultraviolet sensitive to facilitate optical imaging by exposure to ultraviolet radiation through an imaging master; and (3) substantially insensitive to visible radiation so as to facilitate room-light-handling.

The characteristics of the novel printing plate described herein are such that imagewise exposure to activating radiation followed by heating results in opposite effects in exposed and unexposed areas. In particular, in exposed areas the imaging layer becomes less soluble in an aqueous alkaline developing solution while in unexposed areas it becomes more soluble in such solution. These opposing effects contribute to both high speed and high contrast, both of which are highly desirable attributes in a lithographic printing plate.

Since the printing plate of this invention is infrared sensitive, digital imaging information can be conveniently utilized to form continuous or halftone images using a suitable source of infrared radiation such as a laser diode emitting in the infrared region. Since the printing plate of this invention is also ultraviolet sensitive, it can also be conveniently imaged so as to form continuous or halftone images by ultraviolet exposure through a suitable imaging master such as a silver halide film. Because of these characteristics, the same plate can be utilized in equipment intended for input of electronic data by writing with a laser or in the type of equipment that is commonly employed to carry out ultraviolet exposure of lithographic printing plates. It is thus an easy matter to combine digital or electronic imaging techniques with conventional optical imaging techniques, i.e., to use both types of imaging with the same printing plate. Accordingly, information not available in an electronic format can be added by optical imaging techniques to complete the imaging of the lithographic printing plate when it is desired to do so.

To utilize the lithographic printing plate of this invention as a positive-working plate requires that it be imagewise exposed to activating radiation, thereby rendering the exposed areas alkali-soluble, and contacted with an aqueous alkaline developing solution to remove the exposed areas. To utilize it as a negative-working plate requires the steps of imagewise exposure to activating radiation, heating of the plate to provide reduced solubility in exposed areas and increased solubility in unexposed areas, and contact with an aqueous alkaline processing solution to remove the unexposed areas. In contrast with the printing plates of British Patent No. 2,082,339 and U.S. Pat. No. 4,708,925, use of both a resole resin and a novolac resin is essential and the use of two exposure steps is not necessary.

While applicants do not wish to be bound by any theoretical explanation for the manner in which their invention functions, it is believed that it is based upon an acid-catalyzed chemical amplification mechanism which occurs upon heating of the exposed plate. This mechanism reduces the solubility of the exposed areas by hardening the mixture of resins. At the same time, it increases the solubility of the unexposed areas. The mechanism whereby it accomplishes the latter effect is not clearly understood.

The functioning of the plate as a negative-working plate is critically dependent upon the use of a mixture of a resole resin and a novolac resin since the use of either resin alone does not provide a useful developed image.

Exposure of the plate to infrared radiation is believed to decompose both the infrared absorber and the latent Bronsted acid in the exposed areas. The decomposition products are believed to catalyze a reaction between the resole resin and the novolac resin to form a matrix which after heating is insoluble in aqueous alkaline developing solution.

Exposure to ultraviolet radiation also results in decomposition of the latent Bronsted acid to generate a Bronsted acid which catalyzes the matrix-forming reaction between the resole resin and the novolac resin. The plate has a high degree of sensitivity in both the ultraviolet and infrared regions of the spectrum. In other words, it can be exposed at two different wavelengths.

Terephthalaldehyde is utilized in this invention as a speed enhancing agent. It is believed to assist in promoting the matrix-forming reaction between the resole resin and the novolac resin.

DESCRIPTION OF THE PREFERRED EMBODIMENTS

As indicated hereinabove, the radiation-sensitive composition of this invention is comprised of (1) a resole resin, (2) a novolac resin, (3) a latent Bronsted acid, (4) an infrared absorber, and (5) terephthalaldehyde.

Resole resins are well known and widely available on a commercial basis. They are phenolic resins which are obtained by reaction of phenolic compounds with aldehydes. A typical example of a resole resin useful in this invention is a resin prepared from bis-phenol A and formaldehyde. A preferred resole resin that is available on a commercial basis is UCAR phenolic resin BKS-5928 which is available from Georgia Pacific Corporation. Novolac resins are also well known and widely used on a commercial basis. They are phenolic resins which are also obtained by reaction of phenolic compounds with aldehydes but under different reaction conditions than those that produce resole resins. A typical example of a novolac resin useful in this invention is a resin prepared from m-cresol and formaldehyde. A preferred novolac resin that is available on a commercial basis is N-9P NOVOLAK available from Eastman Kodak Company.

Differences between resole resins and novolac resins and the processes used in their preparation are described in U.S. Pat. No. 4,708,925 and in British Patent No. 2,082,339. The resole resins and the novolac resins specifically described in these patents are also useful in the present invention, but the invention requires the use of both a resole resin and a novolac resin, whereas use of both resins is not required in either of these patents.

The radiation-sensitive composition of this invention must contain both a resole resin and a novolac resin. If the resole resin is omitted, the steps of imagewise exposure and heating are not able to provide a useful means of negative imaging since contact with an aqueous alkaline developing solution will not remove the coating from the unexposed areas and the printing plate processed in this manner is not useful. If the novolac resin is omitted, the steps of imagewise exposure and heating are again not able to provide a useful means of imaging since contact with an aqueous alkaline developing solution will remove the coating from both exposed and unexposed areas and the printing plate processed in this manner is not useful.

The third essential ingredient of the radiation-sensitive composition of this invention is a latent Bronsted acid. The term "latent Bronsted acid" refers to a precursor which forms a Bronsted acid by decomposition. The Bronsted acid is believed to catalyze the matrix-forming reaction between the resole resin and the novolac resin. Typical examples of Bronsted acids which are suitable for this purpose are trifluoromethane sulfonic acid and hexafluorophosphoric acid.

Ionic latent Bronsted acids are suitable for use in this invention. Examples of these include onium salts, in particular iodonium, sulfonium, phosphonium, selononium, diazonium and arsonium salts. Specific examples of particularly useful onium salts include:

diphenyliodonium hexafluorophosphate, triphenylsulfonium hexafluoroantimonate, phenylmethyl-ortho-cyanobenzylsulfonium trifluoromethane sulfonate, and 2-methoxy-4-aminophenyl diazonium hexafluorophosphate Non-ionic latent Bronsted acids are also suitable for use in this invention. Examples of these include compounds of the formula:

$RCH_2X$ $RCHX_2$ $RCX_3$ $R(CH_2X)_2$ and $R(CH_2X)_3$ wherein X is Cl, Br, F, or $CF_3SO_3$ and R is an aromatic group, an aliphatic group or a combination of aromatic and aliphatic groups.

Useful ionic latent Bronsted acids include those represented by the formula:

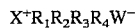

When X is iodine then $R_3$ and $R_4$ are electron lone pairs and $R_1$ and $R_2$ are aryl or substituted aryl groups. When X is S or Se then $R_4$ is an electron lone pair and $R_1$, $R_2$ and $R_3$ can be an aryl group, a substituted aryl group, an aliphatic group or a substituted aliphatic group. When X is P or As, then $R_4$ can be an aryl group, a substituted aryl group, an aliphatic group or a substituted aliphatic group. W can be $BF_4$, $CF_3SO_3$, $SbF_6$, $CCl_3CO_2$, $ClO_4$, $AsF_6$, $PF_6$, or any corresponding acid whose pH is less than three.

Any of the onium salts described in U.S. Pat. No. 4,708,925 can be utilized as the latent Bronsted acid in this invention. These include iodonium, sulfonium, phosphonium, bromonium, chloronium, oxysulfoxonium, oxysulfonium, sulfoxonium, selenonium, telluronium and arsonium salts.

Use of diazonium salts as latent Bronsted acids is particularly preferred in this invention. They provide equivalent sensitivity to other latent Bronsted acids in the infrared region and higher sensitivity in the ultraviolet region.

An additional class of useful latent Bronsted acids are the haloalkyl-substituted s-triazines. The haloalkyl-substituted s-triazines are well known photolytic acid generators. Use of these compounds for this purpose is described, for example, in U.S. Pat. No. 3,779,778.

Preferred haloalkyl-substituted s-triazines for use in this invention are compounds of the formula:

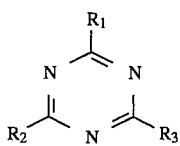

wherein $R_1$ is a substituted or unsubstituted aliphatic or aromatic radical and $R_2$ and $R_3$ are, independently, haloalkyl groups.

In the above formula, it is especially preferred that $R_2$ and $R_3$ are haloalkyl groups of 1 to 4 carbon atoms.

$R_1$ can include any substituent which does not adversely affect the photolytic acid-generating capability of the s-triazine compound. Such substituents include alkyl groups and alkoxy groups.

Particularly preferred haloalkyl-substituted s-triazines for use in this invention are compounds of the formula:

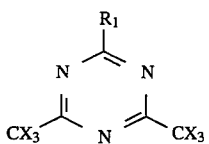

wherein $R_1$ is a substituted or unsubstituted aliphatic or aromatic radical and each X is, independently, a halogen atom.

The most preferred haloalkyl,substituted s-triazines for use in this invention are compounds of the formula:

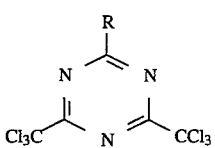

wherein R is an aryl group of 6 to 15 carbon atoms, such as, for example, phenyl or naphthyl.

Specific examples of haloalkyl-substituted s-triazines that are preferred for use in this invention include the following compounds:

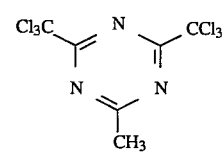

T-1

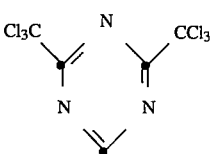

T-2

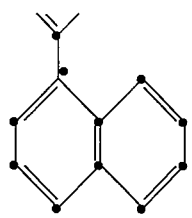

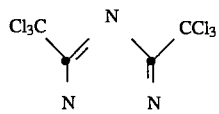

T-3

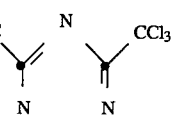

T-4

T-5

The fourth essential ingredient of the radiation-sensitive composition of this invention is an infrared absorber. The infrared absorber renders the composition sensitive to infrared radiation and makes the printing plate useful as a direct laser addressable plate which can be imaged by exposure to a laser which emits in the infrared region.

The infrared absorber can be a dye or pigment. A very wide range of such compounds is well known in the art and includes dyes or pigments of the squarylium, croconate, cyanine, merocyanine, indolizine, pyrylium and metal dithiolene classes. It is preferred that the infrared absorber fragment upon exposure to the activating radiation since the decomposition products promote increased contrast between image and non-image areas and thereby help in the development process.

Additional infrared absorbers that are of utility in this invention include those described in U.S. Pat. No. 5,166,024, issued Nov. 24, 1992. As described in the '024 patent, particularly useful infrared absorbers are phthalocyanine pigments.

The fifth essential ingredient in the radiation-sensitive composition of this invention is the compound terephthalaldehyde. This compound has the formula:

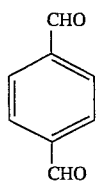

It has been unexpectedly found to function as a highly effective speed-enhancing agent in the radiation-sensitive compositions of this invention.

In a particularly preferred embodiment of the invention, the radiation-sensitive composition also includes a sixth ingredient, namely, 3,4,5-trimethoxybenzoic acid. This compound has the formula:

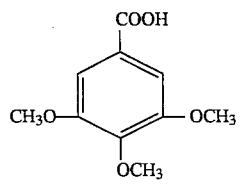

It has been unexpectedly found to enhance the image/non-image contrast. It is believed to do this by undergoing decarboxylation in the image areas, where heat is generated, to an oleophilic material but remaining soluble in base in the non-exposed areas. The 3,4,5-trimethoxybenzoic acid can be described as an agent which promotes background release in the processing of the lithographic printing plates of this invention.

As explained hereinabove, the five essential ingredients of the radiation-sensitive composition of this invention are a resole resin, a novolac resin, a latent Bronsted acid, an infrared absorber, and terephthalaldehyde and the sixth ingredient, 3,4,5-trimethoxybenzoic acid, is optional but preferred. Other ingredients which can optionally be incorporated in the composition include colorants, stabilizers, additional sensitizers, exposure indicators and surfactants.

The thickness of the imaging layer in the printing plates of this invention can vary widely. Typically, a dry thickness in the range of from about 0.5 to about 2 micrometers, more preferably from about 1 to about 1.5 micrometers is suitable.

The lithographic printing plates of this invention can employ any of the supports conventionally used for lithographic printing plates, including supports formed from aluminum or other metals, supports formed from polymers such as polyesters, and supports formed from polymer-coated paper. A preferred support material is grained and anodized aluminum.

To form the printing plate, the resole resin, novolac resin, latent Bronsted acid, infrared absorber, terephthalaldehyde and, optionally, 3,4,5-trimethoxybenzoic acid, are dissolved or dispersed in a suitable solvent in appropriate proportions and coated on the support using such well-known coating techniques as spin coating or hopper coating. Preferred solvents include acetone and 1-methoxy-2-propanol. The resole resin and novolac resin are each incorporated in the coating composition in an amount of from about 1.5 to about 6 percent by weight, more preferably from about 2.5 to about 5.5 percent by weight, and most preferably from about 4.5 to about 5.3 percent by weight. The latent Bronsted acid is incorporated in the coating composition in an amount of from about 0.3 to about 1 percent by weight, more preferably from about 0.45 to about 0.9 percent by weight, and most preferably from about 0.75 to about 0.85 percent by weight. The infrared absorber is incorporated in the coating composition in an amount of from about 0.15 to about 1.1 percent by weight, more preferably from about 0.45 to about 0.9 percent by weight, and most preferably from about 0.68 to about 0.88 percent by weight. The terephthalaldehyde is incorporated in the coating composition in an amount of from about 0.20 to about 2 percent by weight, more preferably from about 0.4 to about 1.6 percent by weight, and most preferably from about 0.8 to about 1.2 percent by weight. In the preferred embodiment of the invention in which 3,4,5-trimethoxybenzoic acid is included, it is typically used in an amount of from about 0.25 to about 1.5 percent by weight.

Suitable conditions for drying the layer involve heating for a period of from about 0.5 to about 10 minutes at a temperature in the range of from about 20° C. to about 150° C.

The lithographic printing plates of this invention can be exposed with a laser diode which emits radiation in the near-infrared region of the spectrum. Such laser diodes provide the advantage of both low cost and low energy consumption. The lithographic printing plates can also be exposed with conventional ultraviolet radiation sources, including carbon arc lamps, mercury vapor lamps, fluorescent lamps, tungsten filament lamps and photoflood lamps.

Exposure of the printing plate results in the formation of an image which is typically visible as a reddish-yellow color on a light green background.

A particularly suitable exposing device is a laser diode with a maximum output at about 800 nanometers. Such a device is typically capable of decomposing both the latent Bronsted acid and the infrared absorber in the exposed areas. The products from the thermal decomposition are mainly strong acids which are effective in crosslinking the resins, thereby altering solubility in aqueous alkaline developing solution.

As described hereinabove, in a negative-working process the imagewise-exposed plate is heated in a step that is referred to as a post-exposure bake or PEB. The heating step is conducted at a temperature in the range of from about 75° C. to about 150° C. for a period of from about 15 to about 300 seconds. More preferably, the heating is for a period of from about 30 to about 90 seconds at a temperature in the range of from about 90° C. to about 110° C. After the PEB is completed, the plate is then either hand processed or machine processed in an aqueous alkaline developing solution until the non-image areas are removed. This typically requires about 30 to about 120 seconds. A preferred aqueous alkaline developing solution is a silicate solution such as a six percent by weight aqueous solution of sodium metasilicate. A suitable commercially available silicate solution for this purpose is KODAK AQUA-IMAGE POSITIVE DEVELOPER MX-1589-1 which is sold by Eastman Kodak Company. After contact with the aqueous alkaline developing solution, the plate is usually treated with a finisher such as gum arabic.

The number of printing impressions obtainable is primarily dependent upon use of a post development baking step. If no such baking step is used, the plate typically provides about 60000 to 70000 impressions, whereas post development baking for about 5 minutes at about 250° C. typically provides about 300000 to about 350000 impressions. The number of impressions that can be attained before wear is detected can also be increased by increasing the coating weight.

It was suprising to find that use of a mixture of a resole resin and a novolac resin provides a printing plate which, upon post-exposure heating, undergoes reactions which both inhibit solubility of the exposed areas and enhance solubility of the unexposed areas. This feature, together with the feature of both ultraviolet and infrared sensitivity, provides a remarkably versatile printing plate. Thus, for example, with this printing plate, the major imaging technique used can be digital imaging with infrared radiation but conventional ultraviolet exposure can be used to add non-digital information to the printing process when such information is not available in a digital format. Higher speeds, greater contrast and simpler processing conditions are attainable because the image and non-image areas are affected in opposite directions at the same time. Prior to this invention, no known lithographic printing plate possessed all of these desirable features.

The invention is further illustrated by the following examples of its practice.

EXAMPLE 1

A control composition which did not contain terephthalaldehyde was prepared by adding the following ingedients to 100 milliliters of 1-methoxy-2-propanol:

(1) 10 milliliters of a 30% by weight solution of a resole resin (UCAR phenolic resin BKS- 5928 available from Georgia Pacific Corporation) in a mixture of 2-butanone and 1-methoxy-2-propanol;

(2) 10 milliliters of a 30% by weight solution of a novolac resin (N-9P NOVOLAK resin available from Eastman Kodak Company) in acetone;

(3) 0.5 grams of diphenyliodonium hexafluorophosphate in 2 milliliters of acetonitrile; and (4) 0.5 grams of an infrared absorbing dye having the following structural formula:

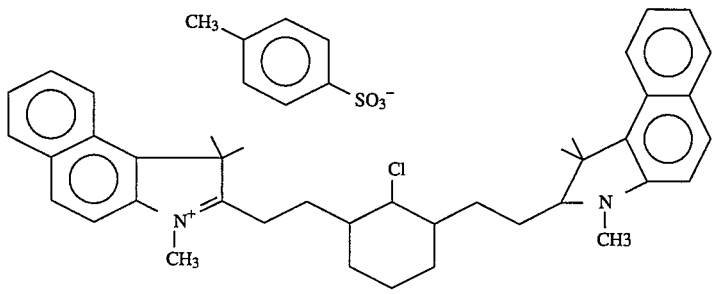

dissolved in 10 milliliters of 1-methoxy-2-propanol.

The resulting solution was spin coated onto an electrochemically grained and anodized aluminum plate at 30 revolutions per minute for one minute and dried in a forced air oven at 100° C. for one minute. After cooling, the plate was imaged using a 500 milliwatt diode laser emitting a modulated pulse centered at 830 nanometers. After imaging, the plate was heated in a forced air oven at 100° C. for one minute, cooled and processed in a mechanical processor using KODAK AQUA IMAGE positive machine developer MX-1589-1. The resulting image was finished by applying a 5% solution of gum arabic and hand buffing with a cloth. The image had an estimated run length of 70000 impressions based on an accelerated wear test. A second plate, identical to the first, was baked at 250° C. for five minutes and had an estimated run length of 350000 impressions.

A second control composition was prepared in which the resole resin was omitted. After exposing and processing in the same manner described above, the non-image areas remained, resulting in a useless printing plate.

A third control composition was prepared in which the novolac resin was omitted. After exposing and processing in the same manner described above, the entire coating in both image and non-image areas was removed from the plate, resulting in a useless printing plate.

A composition designated Example 1 was prepared in the identical manner to the first control composition except that it additionally contained 1.0 grams of terephthalaldehyde. The composition of Example 1 was coated, imaged and processed in the identical manner to that described above.

The plates prepared from the Example 1 composition and the first control composition were analyzed by observing under a microscope the one pixel line width which runs perpendicular to the direction of laser travel, the largest percent dot observed, and the smallest percent dot remaining on the plate. The Dmin and Dmax of the plate were also recorded. The performance of the composition of Example 1 and that of the first control composition was compared with regard to three criteria, first the difference between background and image density (the greater the difference the better the performance), second the range of percent dots for both highlight and shadow (the wider the range the better the performance) and third the ability of the plate to print a one pixel line width. With regard to difference between background and image density, the composition of Example 1 gave similar results to the first control composition (47 density units compared to 49 density units). With regard to dot range, the composition of Example 1 gave superior results to the first control composition. In particular, for the Example 1 composition the smallest shadow dot was 99.8% and the smallest highlight dot was 0.2% for a range of 99.6%. For the first control composition, the smallest shadow dot was 99.8% and the smallest highlight dot was 0.4% for a range of 99.4%. The Example 1 composition was able to print a one pixel line width whereas the first control composition was not.

Similar results to those obtained in Example 1 are obtained when the diphenyliodonium hexafluorophosphate is replaced with triphenylsulfonium hexafluoroantimonate or with phenylmethyl-orthocyanobenzylsulfonium trifluoromethanesulfonate or with 2-methoxy-4-aminophenyl diazonium hexafluorophosphate.

EXAMPLE 2

A lithographic printing plate identical to that of Example 1 was prepared except that 1.0 grams of 3,4,5-trimethoxybenzoic acid was added to the radiation-sensitive composition. The results obtained were similar to those of Example 1 except that the plate could be processed in 20 to 30 percent less time with no loss of contrast.

The invention has been described in detail, with particular reference to certain preferred embodiments thereof, but it should be understood that variations and modifications can be effected within the spirit and scope of the invention.

We claim:
1. A radiation-sensitive composition comprising (1) a resole resin, (2) a novolac resin, (3) a latent Bronsted acid, (4) an infrared absorber, and (5) terephthalaldehyde.
2. A radiation-sensitive composition as claimed in claim 1, wherein said resole resin is derived from bis-phenol A and formaldehyde.
3. A radiation-sensitive composition as claimed in claim 1, wherein said novolac resin is derived from m-cresol and formaldehyde.
4. A radiation-sensitive composition as claimed in claim 1, wherein said latent Bronsted acid is an ionic latent Bronsted acid.
5. A radiation-sensitive composition as claimed in claim 1, whereas said latent Bronsted acid is a non-ionic latent Bronsted acid.
6. A radiation-sensitive composition as claimed in claim 1, wherein said latent Bronsted acid is an iodonium, sulfonium, phosphonium, selononium, diazonium or arsonium salt.
7. A radiation-sensitive composition as claimed in claim 1, wherein said latent Bronsted acid is diphenyliodonium hexafluorophosphate.
8. A radiation-sensitive composition as claimed in claim 1, wherein said latent Bronsted acid is 2-methoxy-4-aminophenyl diazonium hexafluorophosphate.
9. A radiation-sensitive composition is claimed in claim 1, wherein said latent Bronsted acid is a haloalkyl-substituted s-triazine.
10. A radiation-sensitive composition as claimed in claim 1, wherein said latent Bronsted acid is a haloalkyl-substituted s-triazine of the formula:

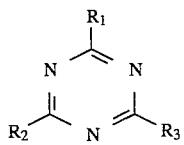

wherein $R_1$ is a substituted or unsubstituted aliphatic or aromatic radical and $R_2$ and $R_3$ are, independently, haloalkyl groups.

11. A radiation-sensitive composition as claimed in claim 1, wherein said latent Bronsted acid is a haloalkyl-substituted s-triazine of the formula:

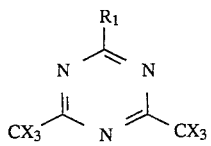

wherein $R_1$ is a substituted or unsubstituted aliphatic or aromatic radical and each X is, independently, a halogen atom.

12. A radiation-sensitive composition as claimed in claim 1, wherein said latent Bronsted acid is a haloalkyl-substituted s-triazine of the formula:

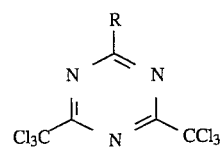

wherein R is an aryl group of 6 to 15 carbon atoms.

13. A radiation-sensitive composition as claimed in claim 1, wherein said infrared absorber is a squarylium, croconate, cyanine, merocyanine, indolizine, pyrylium or metal dithiolene dye or pigment.
14. A radiation-sensitive composition as claimed in claim 1, additionally containing 3,4,5-trimethoxybenzoic acid.
15. A lithographic printing plate comprising a support and an imaging layer that is sensitive to both ultraviolet and infrared radiation and capable of functioning in either a positive-working or negative-working manner, the solubility of said imaging layer in aqueous alkaline developing solution being reduced in exposed areas and increased in unexposed areas by the steps of imagewise exposure to activating radiation and heating; said imaging layer comprising (1) a resole resin (2) a novolac resin, (3) a latent Bronsted acid, (4) an infrared absorber, and (5) terephthalaldehyde.
16. A lithographic printing plate as claimed in claim 15, wherein said imaging layer has a dry thickness in the range of from about 0.5 to about 2 micrometers.
17. A lithographic printing plate as claimed in claim 15, wherein said resole resin is derived from bis-phenol A and formaldehyde.
18. A lithographic printing plate as claimed in claim 15, wherein said novolac resin is derived from m-cresol and formaldehyde.
19. A lithographic printing plate as claimed in claim 15, wherein said latent Bronsted acid is an ionic latent Bronsted acid.
20. A lithographic printing plate as claimed in claim 15, wherein said latent Bronsted acid is a non-ionic latent Bronsted acid.
21. A lithographic printing plate as claimed in claim 15, wherein said latent Bronsted acid is an iodonium, sulfonium, phosphonium, selononium, diazonium or arsonium salt.
22. A lithographic printing plate as claimed in claim 15, wherein said latent Bronsted acid is diphenyliodonium hexafluorophosphate.
23. A lithographic printing plate as claimed in claim 15, wherein said latent Bronsted acid is 2-methoxy-4-aminophenyl diazonium hexafluorophosphate.
24. A lithographic printing plate as claimed in claim 15, wherein said infrared absorber is a squarylium, croconate, cyanine, merocyanine, indolizine, pyrylium or metal dithiolene dye or pigment.
25. A lithographic printing plate as claimed in claim 15, wherein said imaging layer additionally comprises 3,4,5-trimethoxybenzoic acid.
26. A lithographic printing plate as claimed in claim 15, wherein said support is a polyester film.
27. A lithographic printing plate as claimed in claim 15, wherein said support is comprised of grained and anodized aluminum.

* * * * *

UNITED STATES PATENT AND TRADEMARK OFFICE
CERTIFICATE OF CORRECTION

PATENT NO. : 5,466,557
DATED : November 14, 1995
INVENTOR(S) : Neil F. Haley and Steven L. Corbiere It is certified that error appears in the above-identified patent and that said Letters Patent is hereby corrected as shown below:

<u>Title page,</u>
Insert Item -- [*] Notice: The portion of the term of this patent subsequent to 2019 may 13, 2019, has been disclaimed --

Signed and Sealed this

Twenty-ninth Day of June, 2004

JON W. DUDAS
*Acting Director of the United States Patent and Trademark Office*